United States Patent [19]

Findl

[11] 4,247,811
[45] Jan. 27, 1981

[54] BATTERY SENSOR

[75] Inventor: Eugene Findl, Amityville, N.Y.

[73] Assignee: Bioresearch Inc., Farmingdale, N.Y.

[21] Appl. No.: 950,554

[22] Filed: Oct. 12, 1978

Related U.S. Application Data

[63] Continuation-in-part of Ser. No. 860,067, Dec. 13, 1977, abandoned.

[51] Int. Cl.$^3$ ............................ H02J 7/04; G08B 21/00
[52] U.S. Cl. ........................................ 320/35; 320/48;
  324/437; 439/93
[58] Field of Search ........................... 320/46, 48, 35;
  340/636; 324/29.5, 432, 437; 429/90–93

[56] References Cited

U.S. PATENT DOCUMENTS

| | | | |
|---|---|---|---|
| 3,123,758 | 3/1964 | Giacalone | 320/46 X |
| 3,996,579 | 12/1976 | Dahl | 429/92 |
| 4,045,721 | 8/1977 | Swain | 324/29.5 |

*Primary Examiner*—Robert J. Hickey
*Attorney, Agent, or Firm*—Larson, Taylor and Hinds

[57] ABSTRACT

A battery sensor for measuring the state of charge, temperature and electrolyte level of a battery. The state of charge is determined by a concentration cell. The concentration cell comprises an ionic fluid of known concentration separated from the electrolyte by an ionically porous plug. When a first electrode is placed in the electrolyte and a second electrode is placed in the fluid, a voltage, which is a function of the difference in the concentration of each, is generated so that a state of charge of the electrolyte may be determined. Temperature determination is made by positioning thermistors above the electrolyte thereby measuring the gas temperature over the aqueous electrolyte. By positioning one of the thermistors in contact with a catalyst for recombining the gaseous hydrogen, produced by a fully charged battery, with oxygen, sensing means are established for indicating an overcharge situation. The porous plug is positioned at the minimum safety level for the electrolyte such that when the electrolyte falls below the minimum level, the concentration cell voltage between the two electrodes becomes erratic and can be used to activate a warning signal. The sensor is constructed such that the sensing apparatus and voltage generating device can be contained within a battery cap.

10 Claims, 3 Drawing Figures

BATTERY SENSOR

CROSS REFERENCE TO RELATED APPLICATIONS

This application is a continuation-in-part of this inventor's prior U.S. application, Ser. No. 860,067 filed on Dec. 13, 1977, now abandoned.

FIELD OF THE INVENTION

The present invention relates to a battery sensor, and more specifically to a battery cap which contains means for measuring the state of charge, temperature and electrolyte level of the electrolyte in the battery.

BACKGROUND OF THE INVENTION

Battery sensors in the past have been made to measure the temperature, state of charge or level of electrolyte in a battery cell through various independent means.

The state of charge of a battery has previously been determined through direct voltaic measurement as shown in U.S. Pat. No. 1,338,170. State of charge measurements have also been made indirectly by measuring the conductivity and specific gravity of the electrolyte. U.S. Pat. No. 2,836,808 and 3,060,375 disclose the use of conductivity probes in battery testers. U.S. Pat. No. 3,308,366 discloses using either a conductivity probe or a float for specific gravity measurement to determine the state of charge in a battery.

Electrolyte level determination has been made using conductivity probes as shown in U.S. Pat. Nos. 3,308,366 and 2,836,808 such that when the electrolyte level drops below the sensing electrodes, the current path between the electrodes is removed which is registered through a meter response.

Temperature measurements have been effected by such means as contact indicators as disclosed, for example, in U.S. Pat. No. 1,779,946. Temperature compensating conductivity devices are shown in U.S. Pat. Nos. 2,834,937 and 3,657,731 wherein changes in the conductivity of the electrolyte over varying temperatures are automatically compensated for by comparison with a temperature controlled resistance or an incorporated heat-sensing element.

The prior art, however, fails to provide for an efficient combination of sensing elements within a unitary device, such as a battery cap and which senses the temperature, state of charge and electrolyte level in a battery cell.

SUMMARY OF THE INVENTION

The present invention provides a battery sensor for measuring the state of charge, temperature and electrolyte level in battery cells. A concentration cell is established using an ionic fluid of known concentration ionically connected by a porous plug to the electrolyte, from which measurement of the state of charge can be determined. The porous plug is positioned at a minimum safe level of the electrolyte such that when the electrolyte drops below this level, an erratic voltage is produced by the concentration cell indicating the electrolyte should be refilled. One thermistor is provided which senses the temperature of the gas above the electrolyte, thereby measuring the temperature in the battery cell to determine if the battery overheats. A second thermistor is in contact with a catalyst, which activates the recombination of the gaseous hydrogen, produced by a fully or nearly fully charged aqueous battery, with oxygen, and is used to detect when an overcharge situation exists.

In a preferred embodiment of the invention, the sensing means are incorporated within a battery cap providing an efficient combination of sensing means.

Additional features and advantages of the present invention are apparent from, or will be set forth in, the detailed description of the preferred embodiment found hereinbelow.

DETAILED DESCRIPTION OF A PREFERRED EMBODIMENT

Figure 1:
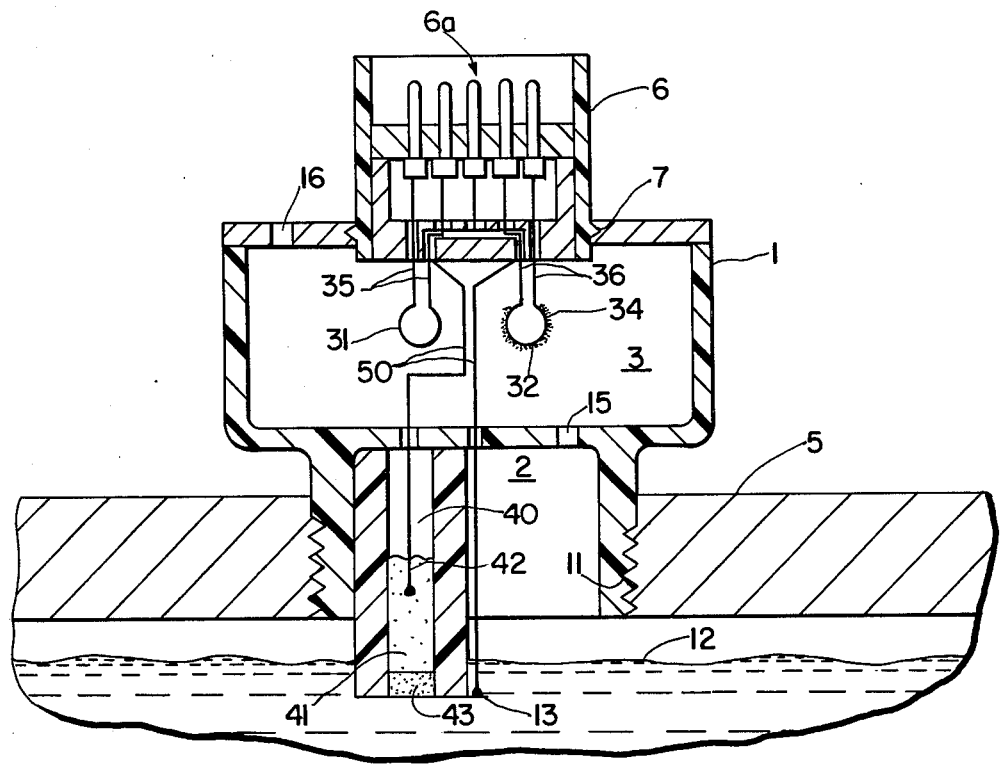
FIG. 1 is a cross-sectional view of a preferred embodiment of a battery cap sensing device incorporating the present invention.

FIG. 1 shows a battery cap 1 with a five-pin electrical connector 6 held in place by snap lock indicated at 7. The bottom end of the battery cap 1 screws down into a battery cell 5 by means of threads 11. The battery cell 5 contains an electrolyte 12. Positioned at or below the base of the cap 1 is the battery electrolyte half cell sensing electrode 13. The electrolyte electrode 13 is so positioned that when the cap 1 is screwed down on the battery cell 5, the electrolyte electrode 13 is positioned such that the free end thereof extends down to a minimum safe level for the battery electrolyte 12.

One or more lower vents, indicated at 15, are provided in a lower chamber 2 formed by cap 1 to allow gases to leave the electrolyte and pass into an upper chamber 3 formed by cap 1. In upper chamber 3, the gases pass around a first thermistor 31 and a second catalyzed thermistor 32. An upper vent 16 allows the gases to escape from upper chamber 3 to the surrounding atmosphere.

The first thermistor 31 is mounted in upper chamber 3 to sense the temperature of the gas which passes through upper chamber 3. The second thermistor 32 is positioned adjacent to the first thermistor 31 and is coated with a catalyst, indicated at 34, such as platinum or palladium black.

Located in the lower portion of the battery cap 1, within lower chamber 2, is a reservoir chamber 40. Chamber 40 contains an ionic reservoir fluid 41, preferably composed of the same type ionic fluid as the battery electrolyte but at a concentration level lower than that of the battery at its fully discharged conditions. Reservoir fluid 41 can be a free liquid or, preferably, a gel. Immersed in reservoir fluid 41 is an ionic fluid reservoir electrode 42. At the lower end of chamber 40 is an ionically porous plug 43, which extends into the electrolyte 12 down to the minimum safe level for the electrolyte. The ionically porous plug 43 may be made of any inert material that minimizes mass transport, but permits ionic contact, such as the product called "Thirsty Glass" made by Corning Glass Inc.

The electrolyte electrode 13 in contact with the electrolyte 12, and the reservoir electrode 42 in contact with the reservoir fluid 41, by means of the ionically porous plug 43, form a concentration cell. Such a cell generates a voltage that is a function of the concentration difference between the two fluids. The optimum choice for the concentration difference is generally the concentration ratio which produces the largest difference in potential. Since some diffusion of electrolyte through the porous plug 43 will occur over a 2-4 year period, (even though the rate of diffusion would be very small), it would be wisest to choose a concentration difference that is minimal but still produces a sufficient potential for easy measurement. For a fully charged lead acid battery electrolyte having a typical full charge concentration of 37.5%$_w$, a reservoir concentration of 5%$_w$ is practicable. The use of a gel, instead of a liquid, for the reservoir fluid helps reduce diffusion through the porous plug.

Figure 2:
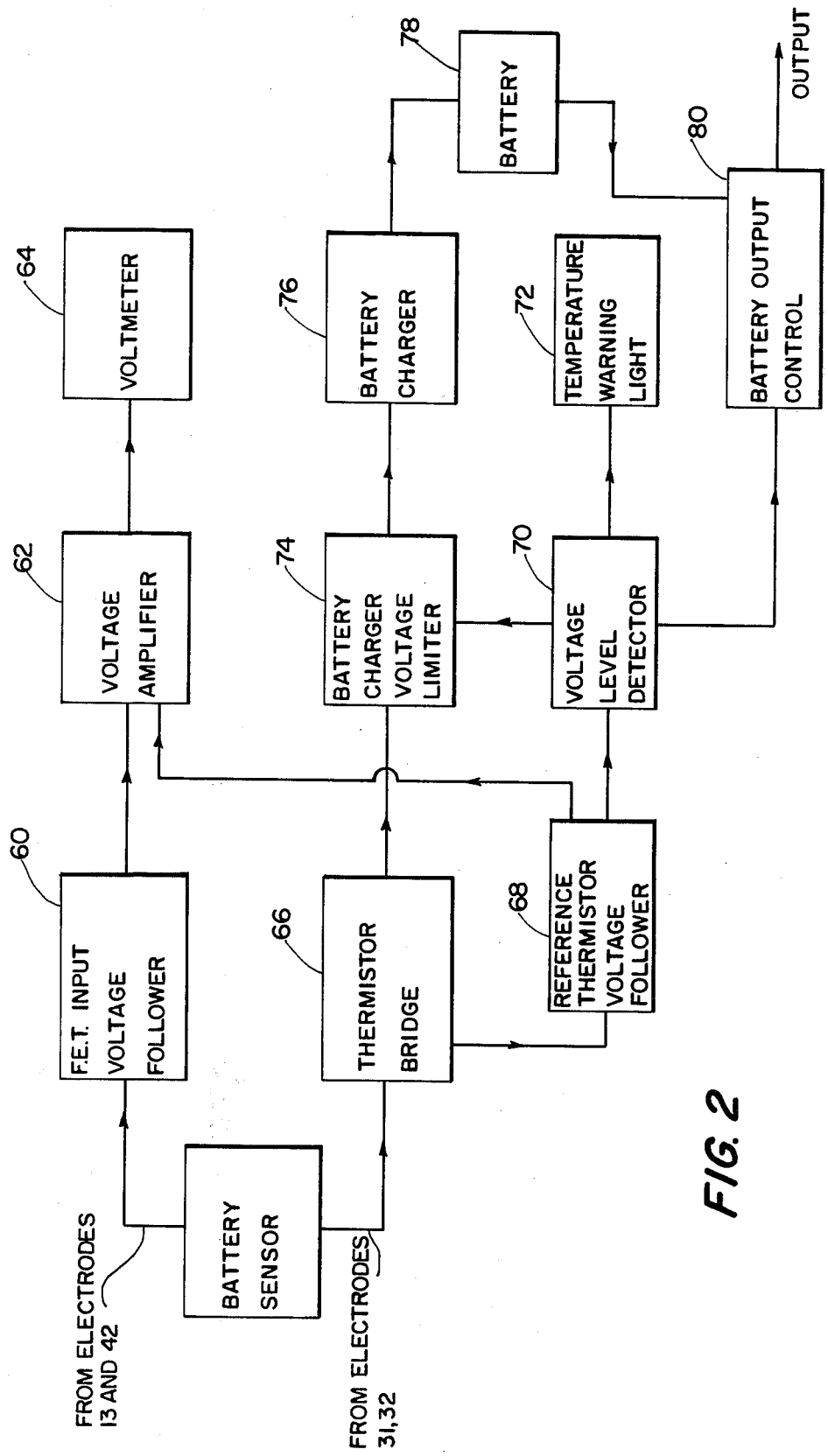
FIG. 2 is a block diagram of a cooperating electrical detection and display system.

Leads or wires 35, 36 and 50 electrically connect the electrolyte electrode 13, the reservoir electrode 42, the first thermistor 31, and the second thermistor 32 to respective pairs of pins 6a of five pin connector 6 and thence to suitable electronic devices, including amplifiers and gauges to be described. A block form circuit diagram of the output circuitry is shown in FIG. 2. The outputs from electrodes 13 and 42 of the battery sensor (generally denoted 58), which electrodes constitute the outputs of the concentration cell, are connected through an FET (field effect transistor) input voltage follower 60 to a temperature compensated voltage amplifier 62, whose output is connected to a voltmeter 64 serving as a state of charge gauge. To further reduce mass transfer between the electrolyte and the reservoir fluid due to current drain between the electrodes, the FET input voltage follower 60 should have an input impedance of $10^{10}$ ohms or greater. In order to compensate for temperature effects on the potential of the concentration cell, an input signal from the first thermistor 31 is incorporated into the amplifier 62 for the concentration cell.

Figure 3:
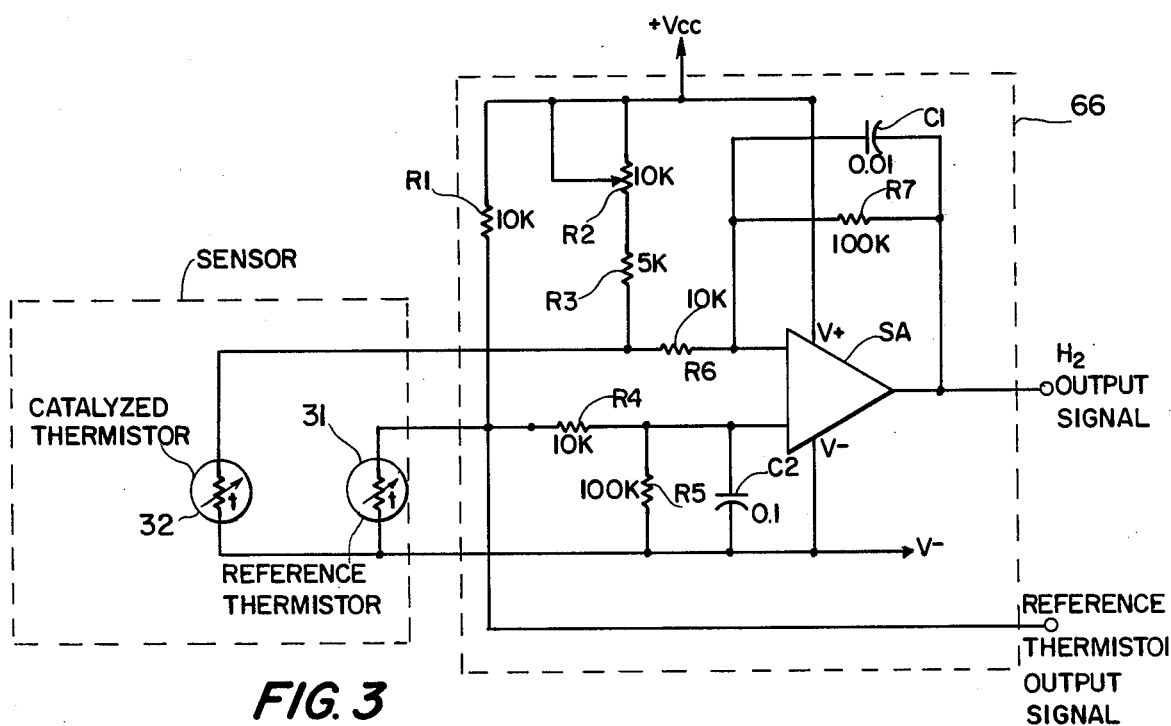
FIG. 3 is a schematic circuit diagram of a cooperating hydrogen detection bridge circuit.

As shown in FIG. 2, the outputs from thermistors 31 and 32 of battery sensor 58 are connected to a thermistor bridge circuit 66, which serves as an H$_2$ detector and which is shown in detail in FIG. 3. The output voltage from the reference thermistor 31 is connected to a reference thermistor voltage follower 68, one output of which is connected to voltage amplifier 62 to provide the temperature compensation referred to and another output of which is connected to a voltage level detector 70 having a temperature warning light 72 associated therewith. The output of thermistor bridge 66 is connected to a battery charger voltage limiter 74 which receives a second input from voltage level detector 70. Battery charger limiter 74 is connected to a battery charger 76 for the battery (denoted 78). Voltage level detector 70 and battery 78 provide inputs to a battery output control circuit 80.

In operation, the battery sensor described above functions in the following manner. After placing the battery cap 1 in position on the battery cell 5, the electrolyte electrode 13 and the porous plug 43 are immersed in the electrolyte 12. The potential produced by the concentration cell, consisting of the electrolyte electrode 13 immersed in the electrolyte 12, the reservoir electrode 42 immersed in the reservoir fluid 41, and the porous plug 43 ionically connecting the two fluids, is a function of the difference in concentration of the two fluids. When a known concentration of reservoir fluid 41 is used, follower 60, amplifier 62 and voltmeter 64 are used to determine the electrolyte concentration. The thermistor 31, which measures the temperature of the battery cell 5, is, as noted, used, by virtue of the connection between thermistor bridge 66, reference thermistor voltage follower 68 and amplifier 62, to compensate for temperature differentials which affect the potential of the concentration cell. Also, should the electrolyte level drop below the minimum safety level, the measured potential of the concentration cell would become erratic, producing an essentially random noise signal. Such a signal is then used to indicate when water or additional electrolyte should be added to the battery. This erratic potential will be readily observable on the display of the state of charge voltmeter 64. However, if desired, a commercially available voltmeter with limit switches (not shown) can be used so that the limit switches trip if the voltage increases or decreases to levels above or below those set by the switches. The limit switches can be connected in series with a low electrolyte level warning light (not shown) so as to turn on the light when the switch is tripped.

An overcharge situation is sensed by first thermistor 31 and second thermistor 32. The detection of battery charge using thermal energy is based on the fact that when aqueous electrolyte batteries are at nearly full charge, decomposition of the electrolyte occurs. The decomposition products include hydrogen and oxygen gases. By detecting the quantity of these gases being emitted, the rate of overcharge can be determined. Vents 15 and 16 allow the gases produced in the electrolyte to reach both thermistor 31 and 32.

Detection of the hydrogen and oxygen produced is accurately accomplished by connecting both thermistors 31 and 32 into the resistance bridge network 66 shown in more detail in FIG. 3. The legs of the bridge circuit are basically formed by (i) thermistor 31; (ii) thermistor 32; (iii) variable resistor R2 and resistor R3; and (iv) resistor R1, with resistors R4, R5 and R6 and capacitor C2 connected to the input of a sensor amplifier SA, and capacitor C1 and resistor R7 connected between one input and the output of amplifier SA. In the presence of the catalyst 34, the hydrogem and oxygen chemically recombine to produce water, while liberating $3.2 \times 10^{-3}$ cal per Mg of water formed. The heat given off by the catalytic oxidation of hydrogen causes the temperature of the second thermistor 32, to be elevated above that of the first thermistor 31 in chamber 3. This temperature difference causes a difference in the current passing through the legs of the bridge network, unbalancing the bridge. The unbalanced bridge signal is then amplified by sensor amplifier SA and used to shut off, or otherwise control, the charging apparatus. To this end, in the specific embodiment illustrated in FIG. 2, the output of bridge 66 is connected to battery charger voltage limiter 74 which controls the operation of battery charger 76.

In addition to determining when the battery is at or nearing full charge, the first thermistor 31 can be used to determine the battery temperature through measuring the temperature of the gas in the battery. The electrolyte and gas temperatures are nearly identical because of the gas contact through the vent 15 with electrolyte 12 as well as the thermal conduction from the battery cell 5 to the battery cap 1. The temperature measurement can be used to prevent battery overheating, thereby avoiding subsequent damage to the battery, as well as controlling a warning light 72 or battery output control circuit 80 which produces a signal that limits the current flowing to or from the battery. As mentioned above, it is also used to compensate for temperature differentials which affect the potential of the concentration cell, through the connection to amplifier 62.

In a preferred embodiment, the various measurements are obtained by a multiple sensing device incorporated within the battery cap, as shown in FIG. 1. The multiple sensing elements are integrated within the cap structure in such a way as to provide an efficient, multipurpose sensing apparatus which can be easily incorporated within a battery control or warning system.

Although the invention has been described relative to an exemplary embodiment thereof, it will be understood that other variations and modifications can be effected in this embodiment without departing from the scope and spirit of the invention.

I claim:

1. A battery sensor for measuring the state of charge, temperature, and electrolyte level of a battery comprising:

a first electrode positioned at a minimum safety level in the electrolyte of the battery;
an ionic fluid of known concentration in a reservoir;
a second electrode immersed in the ionic fluid;
an ionically porous plug positioned at a minimum safety level in the electrolyte, said porous plug separating the electrolyte and the ionic fluid and being in contact with both fluids and a voltage being generated between said electrodes which is a function of the difference in concentration between the electrolyte and ionic fluid so as to determine the state of charge of the battery;
a first thermistor positioned above the electrolyte adapted to measure the temperature of the battery; and
a second thermistor connected to the first thermistor to form a thermistor pair, one of said thermistors being in contact with a catalyst, used as a reaction surface, for promoting the heat-producing recombination of gaseous hydrogen and oxygen evolved by recharging a full or nearly fully charged battery, whereby a temperature differential between the first and second thermistors produces an electrical output signal.

2. A battery sensor for measuring the state of charge, temperature, and electrolyte level of a battery comprising:

a first electrode positioned at a minimum safety level in the electrolyte of the battery;
an ionic fluid of known concentration in a reservoir;
a second electrode immersed in the ionic fluid;
an ionically porous plug positioned at a minimum safety level in the electrolyte, said porous plug separating the electrolyte and the ionic fluid and being in contact with both fluids and a voltage being generated between said electrodes which is a function of the difference in concentration between the electrolyte and ionic fluid so as to determine the state of charge of the battery;
at least one thermistor positioned above the electrolyte adapted to measure the temperature of the battery; and
means associated with said first electrode for detecting an erratic voltage produced when the electrolyte falls below the minimum safety level so as to monitor the electrolyte level, said sensor further including means responsive to an input signal from said thermistor for compensating for potential changes due to temperature changes.

3. The battery sensor described in claim 1 wherein the thermistor, electrodes, and porous plug are disposed within a battery cap.

4. The battery sensor described in claim 2 wherein said ionic fluid is a gel.

5. The battery sensor described in claim 2 wherein said electrolyte and said ionic fluid are both $H_2SO_4$.

6. The battery sensor described in claim 2 wherein said catalyst is composed of a noble metal or mixture of noble metals.

7. The battery sensor described in claim 2 wherein the thermistor pair activates a switch for controlling a battery charging process when the battery is nearing or at full charge.

8. The battery sensor described in claim 1 wherein the thermistor pair, electrodes, and porous plug are disposed within a battery cap.

9. The battery sensor described in claim 2 wherein said electrolyte and said ionic fluid are both KOH.

10. The battery sensor described in claim 1 wherein said thermistor activates a switch for controlling the charge or discharge of the battery to prevent battery overheating.

* * * * *